United States Patent
Morishita et al.

(10) Patent No.: US 7,947,413 B2
(45) Date of Patent: May 24, 2011

(54) PATTERN EVALUATION METHOD

(75) Inventors: Keiko Morishita, Yokohama (JP);
Shingo Kanamitsu, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 289 days.

(21) Appl. No.: 12/247,651

(22) Filed: Oct. 8, 2008

(65) Prior Publication Data

US 2009/0098472 A1    Apr. 16, 2009

(30) Foreign Application Priority Data

Oct. 9, 2007    (JP) ................................. 2007-263690

(51) Int. Cl.
*G03F 9/00* (2006.01)
*G03C 5/00* (2006.01)

(52) U.S. Cl. .............. 430/5; 430/30; 382/144; 382/145; 382/149

(58) Field of Classification Search ................. 430/5, 30; 382/144, 145, 149
See application file for complete search history.

(56) References Cited

U.S. PATENT DOCUMENTS 7,245,356 B2 *    7/2007    Hansen ........................... 355/67

FOREIGN PATENT DOCUMENTS

JP    2007-520755    7/2007

* cited by examiner

*Primary Examiner* — Christopher G Young
(74) *Attorney, Agent, or Firm* — Finnegan, Henderson, Farabow, Garrett & Dunner, L.L.P.

(57) ABSTRACT

In a pattern evaluation method of determining whether a pattern formed on a photomask is acceptable, an aberration parameter of an image quality evaluation apparatus for determining a pattern image intensity in transferring a pattern formed on a photomask onto a wafer is acquired. An acceptance criterion value used in determining whether an abnormal pattern of the photomask including the effect of aberration of the image quality evaluation apparatus is acceptable is set through a lithographic simulation using the acquired aberration parameter. Then, using the image quality evaluation apparatus, an image intensity of the abnormal pattern of the photomask and an image intensity of a normal pattern corresponding to the abnormal pattern are obtained. It is determined whether the difference between the two acquired image intensities is within the set acceptance criterion value.

18 Claims, 5 Drawing Sheets

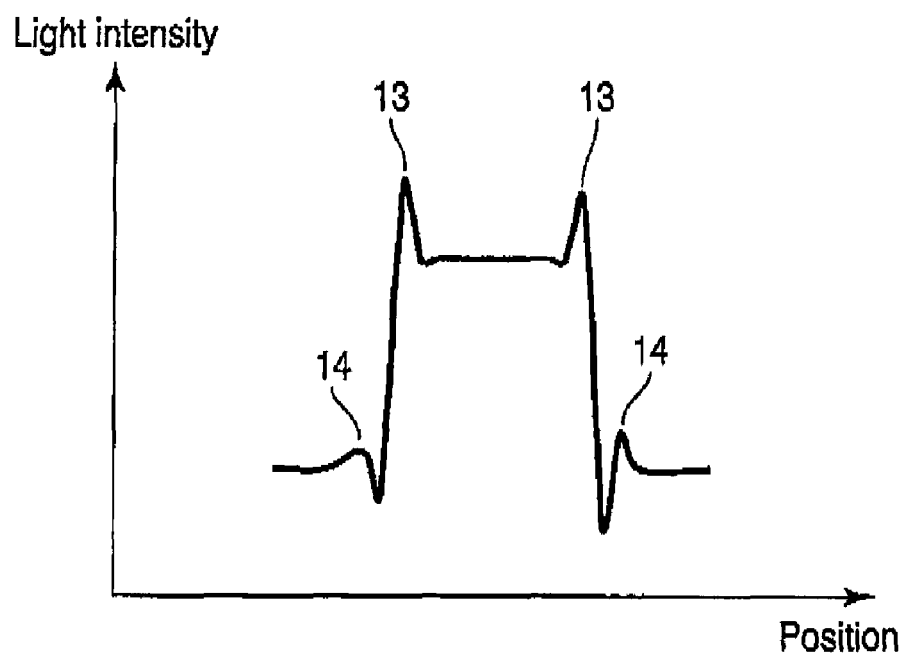
F I G. 8
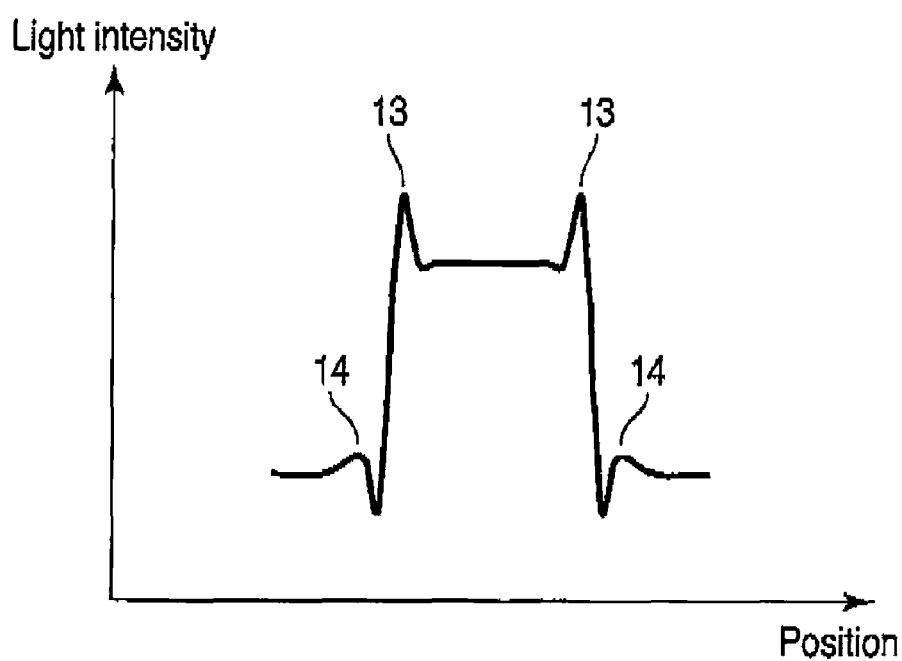
F I G. 9

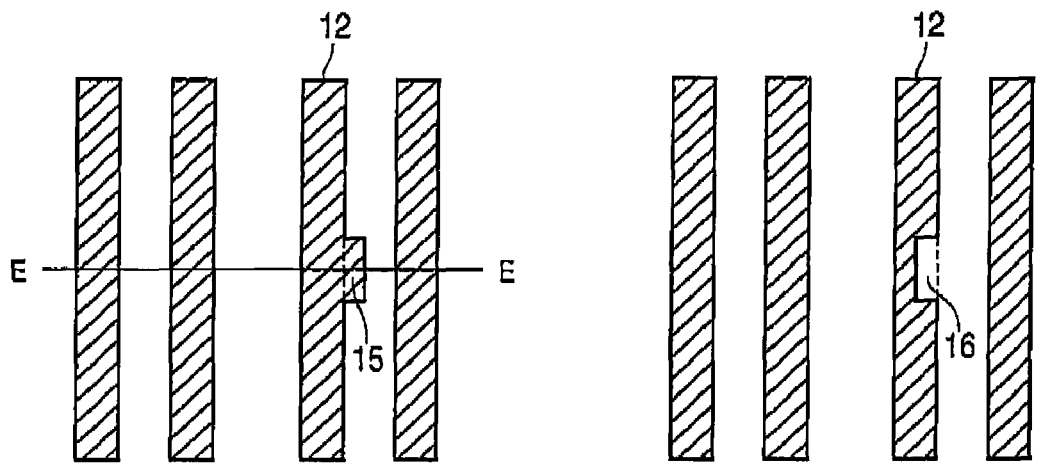
F I G. 10    F I G. 11
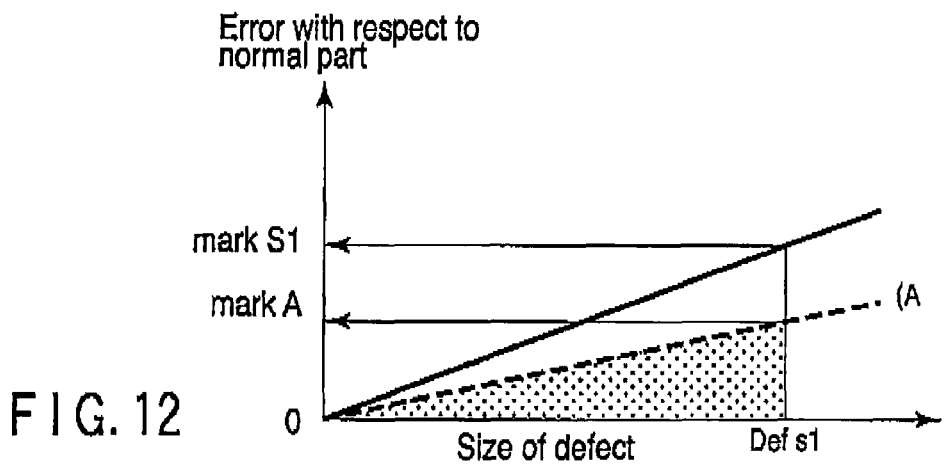
F I G. 12
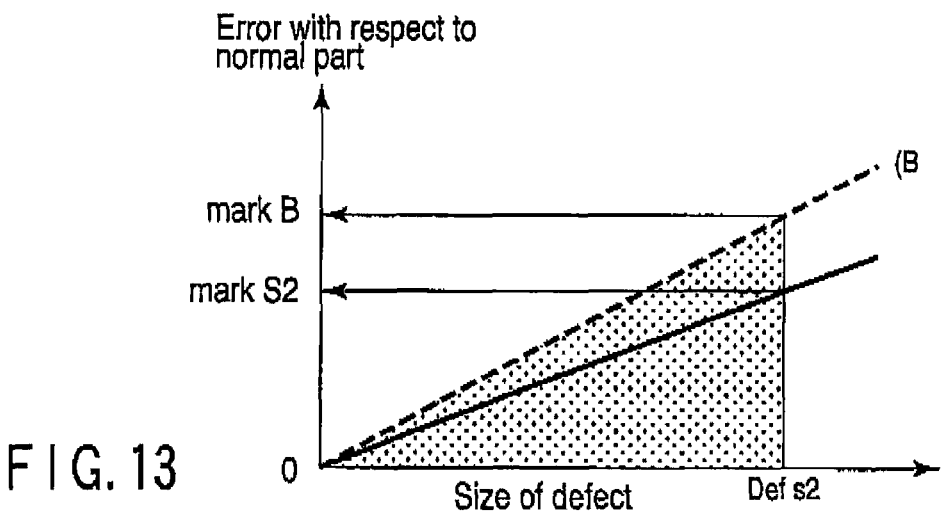
F I G. 13

PATTERN EVALUATION METHOD

CROSS-REFERENCE TO RELATED APPLICATIONS

This application is based upon and claims the benefit of priority from prior Japanese Patent Application No. 2007-263690, filed Oct. 9, 2007, the entire contents of which are incorporated herein by reference.

BACKGROUND OF THE INVENTION

1. Field of the Invention

This invention relates a pattern evaluation method for defective parts or corrected parts of a photomask, and more particularly to a pattern evaluation method using an image quality evaluation apparatus which has the same-wavelength light source and the same optical system as those of an exposure device used for wafer transfer.

2. Description of the Related Art

One known photomask pattern evaluation method is to evaluate the effect of an abnormal part including a defective pattern of a photomask in wafer transfer. Such a pattern evaluation method is used mainly in the process of correcting a defective part of a photomask. In the method, an image quality evaluation apparatus is used. The image quality evaluation apparatus, which has the same-wavelength light source and the same optical system as those of an exposure device, images and analyzes a wafer transfer image as an Aerial Image Measurement System (AIMS), produced by Carl Zeiss, Inc., does.

To evaluate a pattern, the image of an abnormal part, such as a defect in a wafer transfer pattern image or a defect-corrected part is imaged with an image quality evaluation apparatus. On the basis of the image of an abnormal part and the image of a normal part corresponding to the abnormal part (the part obtaining by removing the defects from the abnormal part, or another part whose pattern layout approximates to the part obtained by removing the defects from the abnormal part), a light intensity distribution of the abnormal part is compared with that of the normal part, thereby calculating the variation in, for example, the transmittance of the abnormal part and the dimensions to be transferred to the wafer with respect to the normal part. Then, the pattern is evaluated by determining whether the variations are within an allowable range in a wafer lithographic process.

In such an evaluation method, it is desirable that the image obtained by the image quality evaluation apparatus should coincide completely with a spatial image actually reaching the wafer surface. For various reasons, however, the former actually differs slightly from the latter. One great factor for this is the aberration of the optical system of the apparatus. When the pattern of an abnormal part is evaluated with the image quality evaluation apparatus, measurements are made automatically, including errors caused by the aberration. Since the aberration of the quality evaluation apparatus acting as an inspection apparatus is relatively small, the aberration has caused little trouble.

However, as patterns have been miniaturized further, the effect of aberration has increased, which makes pattern evaluation more difficult. To reduce the aberration, the body of the apparatus has to be improved. The only way to achieve this is either to increase the performance of each of the lenses or to adjust the aberration correction mechanism in a suitable way. However, the aberration cannot be made so small that its effect can be ignored. Depending on the photomask pattern, the effect of the aberration can appear significantly.

Dominant aberrations in evaluating patterns with the image quality evaluation apparatus include coma aberration and astigmatism. Astigmatism causes a phenomenon where the horizontal light condensing position of the optical system differs from the vertical one, resulting in a decrease in the measurement accuracy of the mask pattern. It is said that coma aberration is observed as a result of the disruption of the balance of the sub-peak at the mask pattern edge part. The disruption of the balance is caused by a phenomenon where light does not converge at a point on an imaging surface and forms a fan-like image in such a manner that light leaves traces. The effect of the aberrations makes the light intensity distribution asymmetrical in a part where, for example, a densely arranged pattern part is close to a roughly arranged pattern part, which makes pattern evaluation difficult.

BRIEF SUMMARY OF THE INVENTION

According to an aspect of the invention, there is provided a pattern evaluation method comprising: acquiring an aberration parameter of an image quality evaluation apparatus for determining a pattern image intensity in transferring a pattern formed on a photomask onto a wafer; setting an acceptance criterion value used in determining whether an abnormal pattern of the photomask including the effect of aberration of the image quality evaluation apparatus is acceptable, through a lithographic simulation using the acquired aberration parameter; acquiring an image intensity of the abnormal pattern of the photomask and an image intensity of a normal pattern corresponding to the abnormal pattern with the image quality evaluation apparatus; and determining whether the difference between the two acquired image intensities is within the set acceptance criterion value.

According to another aspect of the invention, there is provided a photomask manufacturing method comprising: acquiring an aberration parameter of an image quality evaluation apparatus for determining a pattern image intensity in transferring a pattern formed on a photomask onto a wafer; setting an acceptance criterion value used in determining whether an abnormal pattern of the photomask including the effect of aberration of the image quality evaluation apparatus is acceptable, through a lithographic simulation using the acquired aberration parameter; acquiring an image intensity of the abnormal pattern of the photomask and an image intensity of a normal pattern corresponding to the abnormal pattern with the image quality evaluation apparatus; determining whether the difference between the two acquired image intensities is within the set acceptance criterion value; and correcting the abnormal pattern determined not to be within the acceptance criterion value.

According to still another aspect of the invention, there is provided a semiconductor device manufacturing method comprising: acquiring an aberration parameter of an image quality evaluation apparatus for determining a pattern image intensity in transferring a pattern formed on a photomask onto a wafer; setting an acceptance criterion value used in determining whether an abnormal pattern of the photomask including the effect of aberration of the image quality evaluation apparatus is acceptable, through a lithographic simulation using the acquired aberration parameter; acquiring an image intensity of the abnormal pattern of the photomask and an image intensity of a normal pattern corresponding to the abnormal pattern with the image quality evaluation apparatus; determining whether the difference between the two acquired image intensities is within the set acceptance criterion value; correcting the abnormal pattern determined not to be within the acceptance criterion value; and transferring a pattern onto a specimen using a photomask subjected to the pattern correction.

BRIEF DESCRIPTION OF THE SEVERAL VIEWS OF THE DRAWING

FIG. 8 is a light intensity profile plot calculated using a lithographic simulation along line B of FIG. 7;

FIG. 9 is a light intensity profile plot measured along line B of FIG. 7 with the image quality evaluation apparatus;

FIG. 10 is a schematic diagram showing a mask pattern with a residual defect in FIG. 1;

FIG. 11 is a schematic diagram showing a mask pattern with a chipped defect in FIG. 1;

FIG. 12 is a graph obtained by plotting errors of a defect with respect to the size of a residual defect of FIG. 10; and FIG. 13 is a graph obtained by plotting errors in a defect with respect to the size of a chipped defect of FIG. 10.

DETAILED DESCRIPTION OF THE INVENTION

Hereinafter, referring to the accompanying drawings, an embodiment of the invention will be explained in detail.

Embodiment

Figure 1:
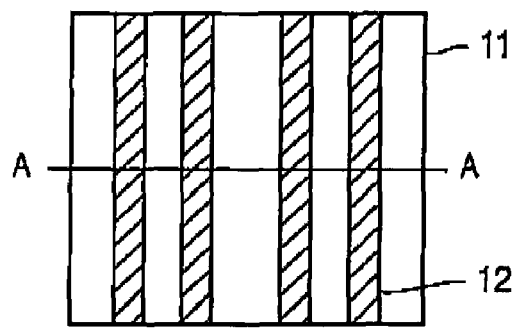
FIG. 1 is a schematic diagram showing a photomask pattern for evaluation according to an embodiment of the invention.
Figure 2:
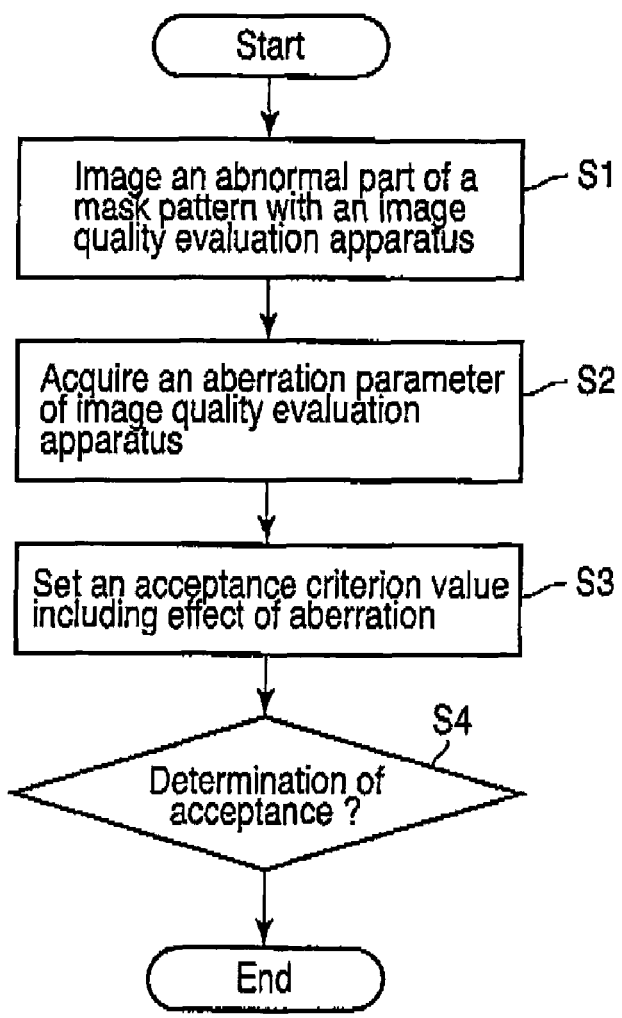
FIG. 2 is a flowchart to help explain a pattern evaluation method according to the embodiment.

First, as shown in FIG. 1, a mask on which a line-and-space pattern has been made of a light-shielding film 12 is prepared on a quartz (Qz) substrate 11 as a photomask. A defect (which denotes a part whose shape differs from a desired pattern in the design data or drawing data on the photomask and is the same as an abnormal part) in the mask is detected and position information on the defect and defect image data are acquired with a mask defect inspection apparatus. On the basis of these pieces of information, an abnormal part including a defect is evaluated with an image quality evaluation apparatus which has a light source whose wavelength is the same as that of an exposure device and the same optical system (NA, $\sigma$, lighting condition) as that of the exposure device. Then, it is determined whether the effect on wafer transfer, the effect of the aberration of the apparatus, can be ignored. The details of the procedure will be explained with reference to a flowchart in FIG. 2.

The mask is put in the image quality evaluation apparatus and measurement conditions are set so as to be the same as the exposure conditions for wafer transfer. After a suitable rotation correction is made, the image quality evaluation apparatus is moved to a mask defect position previously obtained from the defect inspection apparatus. Thereafter, a pattern image for wafer transfer is imaged with a square visual field, about 10 $\mu$m on a side, centering on the defect (step S1). The size of the image can be set to the size of the necessary area according to the mask pattern. Similarly, the image of a normal pattern corresponding to the abnormal pattern in the abnormal part is imaged and a light intensity profile plot corresponding to line A of FIG. 1 in each of the abnormal part and normal part is obtained. At this time, if a normal pattern exists in the image of the abnormal part, a light intensity profile plot of the normal pattern can be obtained from the image of the abnormal part. Therefore, the pattern of the normal part may not be imaged again. That is, when the light intensity profile plot of the pattern in the normal part corresponding to the abnormal part can be estimated from the light intensity distribution of the normal pattern free from defects in the image of the abnormal part, the imaging of the pattern of the normal part may be omitted.

The reason why the normal pattern is subjected to a lithographic simulation is that it is difficult to evaluate an abnormal pattern using a lithographic simulation. The reason is further that an abnormal pattern differs from a pattern of design data and an abnormal part develops accidentally.

Figure 3:
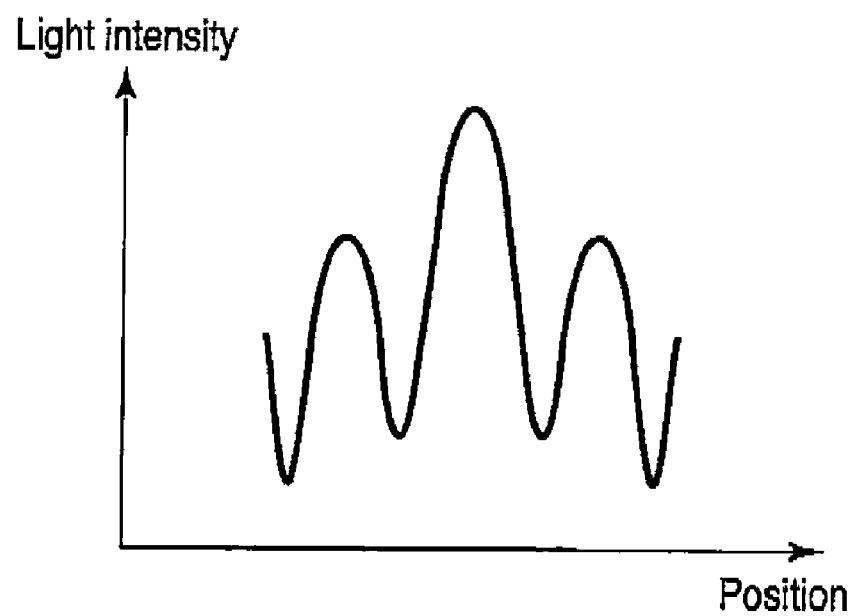
FIG. 3 is a light intensity profile plot calculated using a lithographic simulation along line A of FIG. 1.
Figure 4:
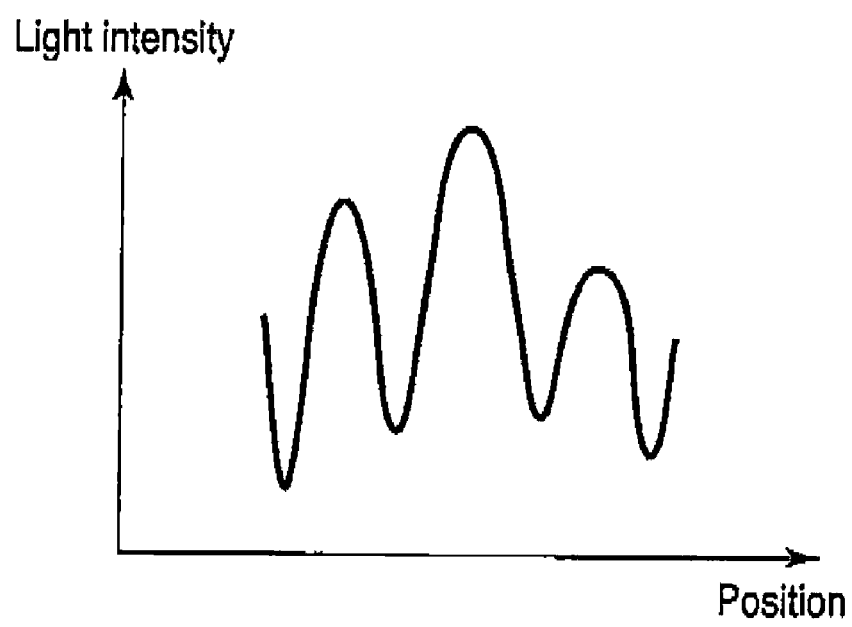
FIG. 4 is a light intensity profile plot measured along line A of FIG. 1 with an image quality evaluation apparatus.

Here, the light intensity profile plot obtained with the image quality evaluation apparatus is not an ideal light intensity profile plot calculated using a simulation as shown in FIG. 3 and is affected by the aberration of the image quality evaluation apparatus as shown in FIG. 4. Since the light intensity distribution differs from an ideal one, it is difficult to evaluate the patterns accurately. To overcome this problem, the amount of aberration of the image quality evaluation apparatus is determined using a lithographic simulation (step S2).

Figure 5:
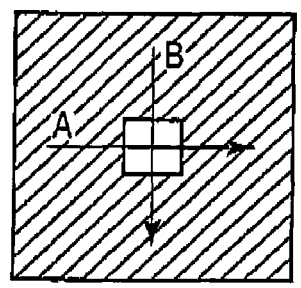
FIG. 5 is a schematic diagram of a hole pattern used for measuring astigmatism.
Figure 6:
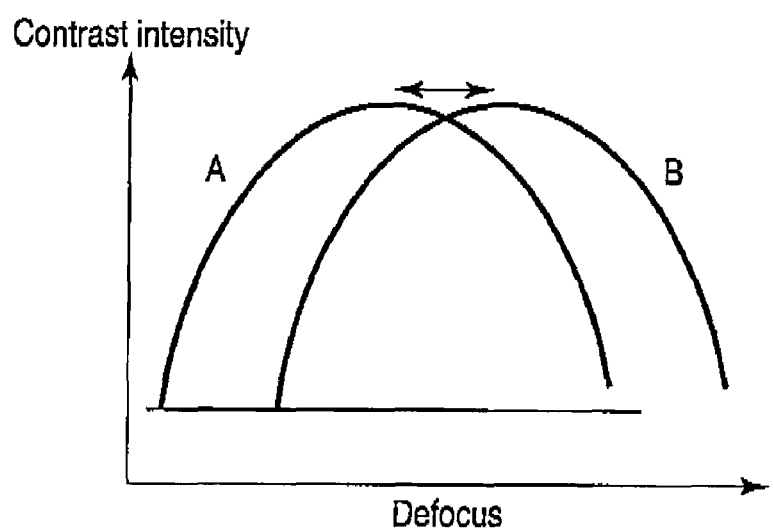
FIG. 6 is a graph obtained by plotting a defocus characteristic of contrast in each of the vertical and horizontal directions shown by the arrows in FIG. 5.

First, the parameter for an astigmatism value is obtained. Since astigmatism is caused by the difference between the vertical focus position and the horizontal focus position, the astigmatism value is obtained using a hole pattern that enables the vertical and horizontal focus positions to be measured at the same time. With a mask having a square hole pattern, 0.5 to 1 $\mu$m on a side, as shown in FIG. 5, a plurality of points are imaged in defocus by the image quality evaluation apparatus. The vertical contrast and horizontal contrast as shown by arrows A and B in FIG. 5 are analyzed and a defocus characteristic is plotted as in FIG. 6. In FIG. 6, the place where the contrast is the highest is a focus position. The difference between the vertical focus position and the horizontal focus position is calculated. The difference of the focus position on the image surface results from astigmatism. The calculated difference is the amount of astigmatism of the image quality evaluation apparatus.

Under the same measuring condition as that for obtaining the astigmatism value using the hole pattern of FIG. 5, a spatial image is calculated using a lithographic simulation. In a calculation taking no account of aberration, there is no shift in the focus position. When the parameter corresponding to the astigmatism in the lithographic simulation is changed, the difference between the vertical focus position and the horizontal focus position occurs. The parameter is changed in such a manner that the difference becomes equal to the measured amount of astigmatism of the image quality evaluation apparatus. The parameter value at a position where the difference coincides with the measured value is found. At this time, the terms related to astigmatism such as the fifth and sixth terms in a Zernike polynomial, are used as parameters. By the method, the value of astigmatism of the image quality evaluation apparatus is quantified using a simulation and this value is used as Asti.

Figure 7:
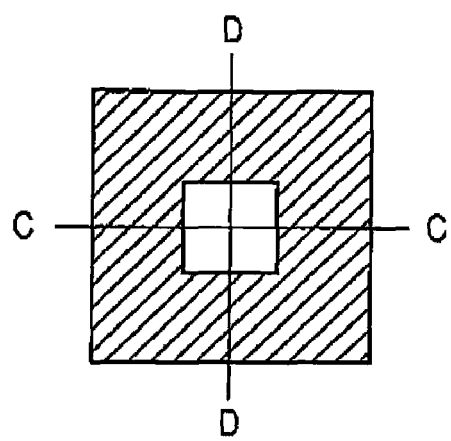
FIG. 7 is a schematic diagram of a hole pattern used for measuring coma aberration.

Next, to calculate the coma aberration of the image quality evaluation apparatus, an image is imaged by the image quality apparatus using a mask pattern which enables coma aberration to be calculated with such a relatively simple structure as a square hole pattern, 4 to 5 μm on a side, shown in FIG. 7. Then, the light intensity profile plots corresponding to line C and line D of FIG. 7 are obtained. Line C is used to calculate a coma aberration value affecting the horizontal direction and line D is used to calculate a coma aberration value affecting the vertical direction.

As a result of coma aberration, the peaks 13, 14 at the edge parts of the light intensity profile plot along line C have a left-right asymmetrical shape as shown in FIG. 8. The difference between the individual peak heights is calculated. Then, using a lithographic simulation, a spatial image of a similar hole pattern is calculated. If calculations are done without giving a coma aberration value, the left and right peaks of the light intensity profile plot obtained as in FIG. 9 coincide with each other.

The 7th, 14th, 23rd, and 34th terms in a Zernike polynomial are used as the parameters related to coma aberration. In addition to these, there are the 8th, 15th, 24th, and 35th terms in the Zernike polynomial as the parameters related to coma aberration. However, they are not used here because they affect the vertical light intensity distribution. A change in the light intensity distribution caused by each of the parameters of the 7th, 14th, 23rd, and 34th terms is calculated. On the basis of the result, the value of the 7th term is changed so as to make almost the same difference as the measured value. If the measured value (FIG. 8) does not coincide with the peak of the simulation value using only the value of the 7th term, the value of each of the 14th, 23rd, and 34th terms is changed in that order so that the peak differences and shapes measured with the image quality evaluation apparatus may coincide with one another. Let the parameter values obtained here be Coma-X.

In the light intensity profile plot along line D in the vertical direction, too, a coma aberration value is determined in the same manner using a lithographic simulation. In this case, the parameters used are the 8th, 15th, 24th, and 35th terms in the Zernike polynomial. Let the parameter values obtained here be Coma-Y.

On the basis of the aberration parameters obtained by the above method, a final adjustment of the aberration value is made according to a pattern to be evaluated.

First, using the pattern of FIG. 1, a spatial image is calculated using a lithographic simulation under the same exposure condition as that for the measurement of the image quality evaluation apparatus, thereby obtaining a light intensity profile plot shown in FIG. 4. The aberration parameters Asti, Coma-X, and Coma-Y are input to make calculations. If the obtained light intensity profile plot does not coincide with the light intensity profile plot of the actual measurement values of FIG. 4, the aberration parameters are newly changed slightly to make a fine adjustment. Then, the finally obtained aberration value is used as aberration parameter X.

The value of aberration parameter X differs, depending on the exposure conditions (NA, sigma aperture, pupil shape) or the type of pattern. Therefore, the aberration values have to be adjusted for each of the exposure conditions and mask patterns on the basis of the aberration values obtained using the basic exposure conditions, including as Asti, Coma-X, and Coma-Y, and the type of pattern.

Next, using aberration parameter X, an acceptance criterion value for pattern evaluation is set (step S3).

On the basis of a defect image on the mask defect inspection apparatus or an image under a scanning electron microscope (SEM), the shape of a defect in an abnormal part is extracted. Then, it is determined whether the extracted defect is a residual defect caused as a result of an unnecessary light-shielding film remaining in a place not shown in the mask drawing data or a chipped defect caused as a result of a light-shielding film getting chipped. FIG. 10 shows a state where a residual defect 15 has occurred and FIG. 11 shows a state where a chipped defect 16 has occurred. Moreover, the defect size is measured roughly to determine how large the defect is for the pattern.

First, when a defect is a residual defect 15 as shown in FIG. 10, the range of errors in the defective part for a wafer transfer image is calculated using a simulation. FIG. 10 shows a structure where the line-and-space pattern 12 of FIG. 1 is arranged. A residual defect 15 has occurred in the pattern 12. A light intensity profile plot along line E of FIG. 10 is observed. Thereafter, the size of the defect along line E is changed according to the pattern size of the mask. An error is calculated for a plurality of sizes using a lithographic simulation. The tendency of the degree of effect of the defect is shown in graph form.

As for errors, a change in the pattern dimensions after the wafer transfer of an abnormal part compared with a normal part is determined using the following expression:

$$|\text{the dimensions of a normal part} - \text{the dimensions of a defective part}|/\text{the dimensions of the normal part} \times 100(\%) \quad (1)$$

The graph of FIG. 12 is obtained by finding changes in the pattern dimensions after wafer transfer caused by a defect as shown in FIG. 10 and plotting a difference from the normal part for the size of the defect. In a defect error evaluation method, the evaluation point may differ according to the position of a defect or the pattern shape. Alternatively, a method of evaluating the difference of pattern dimensions or the relative difference of transmittance may be used. From the graph of FIG. 12, the threshold value (Def-s1) of a defect size is determined which meets an acceptance criterion value 1 (mark-S1) set as a range in which the effect of a defect in a photomask pattern on actual wafer transfer can be ignored.

Next, under the conditions including aberration parameter X, an error caused by the residual defect 15 is calculated. The tendency of the degree of effect of the defect is shown in graph form (a dotted line in FIG. 12). At this time, the comparison with the actual measurement value of the image quality evaluation apparatus including the effect of aberration is made at several points, making it possible to consider the effect of aberration more accurately, which improves the pattern evaluation accuracy. In a state where the aberration parameter is included, let acceptance criterion value 2 corresponding to Def-s1 be mark-A.

Next, when a chipped defect 16 as shown in FIG. 11 is arranged on the same pattern as the one on which the defect of FIG. 10 is arranged, an acceptance criterion value 2 taking the effect of aberration into account is set.

The chipped defect 16 as shown in FIG. 11 is calculated by the same method using a simulation and the degree of effect of the defect is shown in graph form (FIG. 13). A solid line in FIG. 13 shows the degree of effect on the condition that there is no aberration. A dotted line shows the degree of effect on the condition that aberration values are included. From the graph of FIG. 13, the threshold value (Def-s2) of a defect size is determined which meets an acceptance criterion value 2 (mark-S2) set as a range in which the effect of a defect on wafer transfer can be ignored. In a state where the aberration parameter is included, let acceptance criterion value 2 corresponding to Def-s2 be mark-B.

When an acceptance criterion value is set, any one of the acceptance criterion values 1 and 2 may be used according to the type or position of a defect, the size of a mask pattern, dimensions, or shape. The acceptance criterion value 1 is a criterion value of the degree of effect of a defect for a spatial image when there is no aberration and a pattern is transferred ideally onto a wafer. The acceptance criterion value 2 is a criterion value of the degree of effect of a defect for a spatial image including the aberration value of the image quality evaluation apparatus. For example, an error in the defect of FIG. 10 is affected by the aberration and is under condition mark-A stricter than the acceptance criterion value mark-S1 in ideal wafer transfer as shown in FIG. 12. However, an error in the defect of FIG. 11 is under condition mark-B less strict than mark-S2 as shown in FIG. 13. As described above, the setting of the acceptance criterion value 2 not only makes the criterion value stricter, taking the effect of aberration into account, but also optimizes the value according to the type or position of a defect or the position of a pattern.

In this way, an acceptance criterion value including the effect of aberration of the image quality evaluation apparatus can be set. Next, an abnormal pattern including a defect in the photomask is evaluated with the image quality evaluation apparatus.

As in step S1 explained above, on the basis of position information on a defect acquired from the defect inspection apparatus, a square mask area, about 10 μm on a side, including a defect is imaged with the image quality evaluation apparatus, thereby obtaining an image intensity of an abnormal part. If there are a plurality of defects, an image intensity is obtained for each of all the defects. The following admission decision is made on all of the defects.

On the basis of the light intensity distribution of the defective part of the abnormal part acquired from the image quality evaluation apparatus, a change (error) in the dimensions of the defective part with respect to the normal part after wafer transfer is calculated using expression (1) described above. On the basis of acceptance criterion value 2 (mark-A or mark-B) obtained by the above method, it is determined whether an error caused by a defect is acceptable (step S4). If the error exceeds acceptance criterion value 2 and the defect in the abnormal part has to be corrected, the defect is corrected by a mask defect correction unit. Thereafter, the defect-corrected part is measured again with the image quality evaluation apparatus and it is determined on the basis of acceptance criterion value 2 (mark-A or mark-B) whether the defect is within an error range.

As described above, the aberration of the image quality evaluation apparatus is obtained and an acceptance criterion value is set through a lithographic simulation using the aberration, which makes it possible to reduce a measurement error caused by the aberration of the image quality evaluation apparatus. Accordingly, the accuracy of pattern evaluation by the image quality evaluation apparatus can be improved.

Moreover, a strict acceptance criterion value including an error in the aberration of the apparatus is not set and additional work of correcting even a part where the effect of a detect on pattern transfer is within an allowable error range can be omitted.

Furthermore, using a mask determined to be acceptable by such an evaluation method, a wafer on which surface a high-accuracy pattern has been formed within an allowable error range according to the dimensions, shape, and layout set in the design stage can be obtained. Thereafter, by a well-known dicing process, mount process, banding process, packaging process, and other processes, a desired design pattern is formed on the wafer. Then, a semiconductor device including the wafer is obtained. That is, applying the invention to a semiconductor device manufacturing method enables a highly reliable semiconductor device to be realized.

MODIFICATION

The invention is not limited to the above-described embodiment. While in the embodiment, a transparent substrate on which a pattern of a light-shielding material has been formed is used as a photomask, the invention is not limited to this and may be applied to a transparent substrate on which a translucent pattern (halftone pattern) has been formed. Furthermore, in the process of obtaining the aberration of the image quality evaluation apparatus, not only coma aberration and astigmatism but also other aberration parameters may be obtained at the same time.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A pattern evaluation method comprising:
  acquiring an aberration parameter of an image quality evaluation apparatus for determining a pattern image intensity in transferring a pattern formed on a photomask onto a wafer;
  setting an acceptance criterion value used in determining whether an abnormal pattern of the photomask including the effect of aberration of the image quality evaluation apparatus is acceptable, through a lithographic simulation using the acquired aberration parameter;
  acquiring an image intensity of the abnormal pattern of the photomask and an image intensity of a normal pattern corresponding to the abnormal pattern with the image quality evaluation apparatus; and
  determining whether the difference between the two acquired image intensities is within the set acceptance criterion value.

2. The pattern evaluation method according to claim 1, wherein, to obtain the aberration parameter of the image quality evaluation apparatus,
  causing the image quality evaluation apparatus to determine a light intensity profile plot for a specific pattern for calculating the amount of aberration formed on the photomask and calculating an aberration parameter from the light intensity profile plot,
  causing the image quality evaluation apparatus to determine a light intensity profile plot for the normal pattern, and determining a light intensity profile plot for the normal pattern using a lithographic simulation while changing the calculated aberration parameter, and obtaining an aberration parameter when the light intensity profile plot for the normal pattern obtained using the lithographic simulation is nearest to the light intensity profile plot for the normal pattern obtained by the image quality evaluation apparatus.

3. The pattern evaluation method according to claim 1, wherein, to set the acceptance criterion value,
  determining a first light intensity profile plot corresponding to the abnormal pattern using a lithographic simulation to which the aberration parameter has not been added, determining a second light intensity profile plot corresponding to the abnormal pattern using a lithographic simulation to which the aberration parameter has been added, determining a first acceptance criterion value from the first light intensity profile plot, thereby determining a threshold value of a defect size of the abnormal pattern, and determining a second acceptance criterion value corresponding to the threshold value from the second light intensity profile plot and setting the second acceptance criterion value as an acceptance criterion value.

4. The pattern evaluation method according to claim 3, wherein the first acceptance criterion value is a value set as a range where the effect of a defect in the photomask on actual wafer transfer is practically ignorable under the condition that the aberration parameter of the image quality evaluation apparatus is ignored, and the second acceptance criterion value is a value set as a range where the effect of a defect in the photomask on actual water transfer is practically ignorable under the condition that the aberration parameter of the image quality evaluation apparatus is taken into account.

5. The pattern evaluation method according to claim 1, wherein the aberration includes coma aberration and astigmatism and the aberration parameter is set using a Zernike polynomial for a projection optical system in a lithographic simulation.

6. The pattern evaluation method according to claim 1, wherein an image quality evaluation apparatus performs imaging corresponding to a wafer transfer image obtained by transferring a pattern of the photomask onto the wafer with an exposure device and uses the same-wavelength light source and the same optical system condition as those of the exposure device.

7. A photomask manufacturing method comprising:

acquiring an aberration parameter of an image quality evaluation apparatus for determining a pattern image intensity in transferring a pattern formed on a photomask onto a wafer;

setting an acceptance criterion value used in determining whether an abnormal pattern of the photomask including the effect of aberration of the image quality evaluation apparatus is acceptable, through a lithographic simulation using the acquired aberration parameter;

acquiring an image intensity of the abnormal pattern of the photomask and an image intensity of a normal pattern corresponding to the abnormal pattern with the image quality evaluation apparatus;

determining whether the difference between the two acquired image intensities is within the set acceptance criterion value; and correcting the abnormal pattern determined not to be within the acceptance criterion value.

8. The photomask manufacturing method according to claim 7, wherein, to obtain the aberration parameter of the image quality evaluation apparatus, causing the image quality evaluation apparatus to determine a light intensity profile plot for a specific pattern for calculating the amount of aberration formed on the photomask and calculating an aberration parameter from the light intensity profile plot, causing the image quality evaluation apparatus to determine a light intensity profile plot for the normal pattern, and determining a light intensity profile plot for the normal pattern using a lithographic simulation while changing the calculated aberration parameter, and obtaining an aberration parameter when the light intensity profile plot for the normal pattern obtained using the lithographic simulation is nearest to the light intensity profile plot for the normal pattern obtained by the image quality evaluation apparatus.

9. The photomask manufacturing method according to claim 7, wherein, to set the acceptance criterion value, determining a first light intensity profile plot corresponding to the abnormal pattern using a lithographic simulation to which the aberration parameter has not been added, determining a second light intensity profile plot corresponding to the abnormal pattern using a lithographic simulation to which the aberration parameter has been added, determining a first acceptance criterion value from the first light intensity profile plot, thereby determining a threshold value of a defect size of the abnormal pattern, and determining a second acceptance criterion value corresponding to the threshold value from the second light intensity profile plot and setting the second acceptance criterion value as an acceptance criterion value.

10. The photomask manufacturing method according to claim 9, wherein the first acceptance criterion value is a value set as a range where the effect of a defect in the photomask on actual wafer transfer is practically ignorable under the condition that the aberration parameter of the image quality evaluation apparatus is ignored, and the second acceptance criterion value is a value set as a range where the effect of a defect in the photomask on actual wafer transfer is practically ignorable under the condition that the aberration parameter of the image quality evaluation apparatus is taken into account.

11. The photomask manufacturing method according to claim 7, wherein the aberration includes coma aberration and astigmatism and the aberration parameter is set using a Zernike polynomial for a projection optical system in a lithographic simulation.

12. The photomask manufacturing method according to claim 7, wherein the image quality evaluation apparatus performs imaging corresponding to a wafer transfer image obtained by transferring a pattern of the photomask onto the wafer with an exposure device and uses the same-wavelength light source and the same optical system condition as those of the exposure device.

13. A semiconductor device manufacturing method comprising:

acquiring an aberration parameter of an image quality evaluation apparatus for determining a pattern image intensity in transferring a pattern formed on a photomask onto a wafer;

setting an acceptance criterion value used in determining whether an abnormal pattern of the photomask including the effect of aberration of the image quality evaluation apparatus is acceptable, through a lithographic simulation using the acquired aberration parameter;

acquiring an image intensity of the abnormal pattern of the photomask and an image intensity of a normal pattern corresponding to the abnormal pattern with the image quality evaluation apparatus;

determining whether the difference between the two acquired image intensities is within the set acceptance criterion value;

correcting the abnormal pattern determined not to be within the acceptance criterion value; and transferring a pattern onto a specimen using a photomask subjected to the pattern correction.

14. The semiconductor device manufacturing method according to claim 13, wherein, to obtain the aberration parameter of the image quality evaluation apparatus,
  causing the image quality evaluation apparatus to determine a light intensity profile plot for a specific pattern for calculating the amount of aberration formed on the photomask and calculating an aberration parameter from the light intensity profile plot,
  causing the image quality evaluation apparatus to determine a light intensity profile plot for the normal pattern, and determining a light intensity profile plot for the normal pattern using a lithographic simulation while changing the calculated aberration parameter, and obtaining an aberration parameter when the light intensity profile plot for the normal pattern obtained using the lithographic simulation is nearest to the light intensity profile plot for the normal pattern obtained by the image quality evaluation apparatus.

15. The semiconductor device manufacturing method according to claim 13, wherein, to set the acceptance criterion value,
  determining a first light intensity profile plot corresponding to the abnormal pattern using a lithographic simulation to which the aberration parameter has not been added,
  determining a second light intensity profile plot corresponding to the abnormal pattern using a lithographic simulation to which the aberration parameter has been added,
  determining a first acceptance criterion value from the first light intensity profile plot, thereby determining a threshold value of a defect size of the abnormal pattern, and
  determining a second acceptance criterion value corresponding to the threshold value from the second light intensity profile plot and setting the second acceptance criterion value as an acceptance criterion value.

16. The semiconductor device manufacturing method according to claim 15, wherein the first acceptance criterion value is a value set as a range where the effect of a defect in the photomask on actual wafer transfer is practically ignorable under the condition that the aberration parameter of the image quality evaluation apparatus is ignored, and
  the second acceptance criterion value is a value set as a range where the effect of a defect in the photomask on actual wafer transfer is practically ignorable under the condition that the aberration parameter of the image quality evaluation apparatus is taken into account.

17. The semiconductor device manufacturing method according to claim 13, wherein the aberration includes coma aberration and astigmatism and the aberration parameter is set using a Zernike polynomial for a projection optical system in a lithographic simulation.

18. The semiconductor device manufacturing method according to claim 13, wherein the image quality evaluation apparatus performs imaging corresponding to a wafer transfer image obtained by transferring a pattern of the photomask onto the wafer with an exposure device and uses the same-wavelength light source and the same optical system condition as those of the exposure device.

* * * * *

UNITED STATES PATENT AND TRADEMARK OFFICE
CERTIFICATE OF CORRECTION

PATENT NO. : 7,947,413 B2
APPLICATION NO. : 12/247651
DATED : May 24, 2011
INVENTOR(S) : Morishita et al.

Page 1 of 1

It is certified that error appears in the above-identified patent and that said Letters Patent is hereby corrected as shown below:

Claim 4, column 9, line 20, change "water transfer" to --wafer transfer--.

Signed and Sealed this
Ninth Day of August, 2011

David J. Kappos
*Director of the United States Patent and Trademark Office*